United States Patent [19]

Hong

[11] Patent Number: 5,464,785
[45] Date of Patent: Nov. 7, 1995

[54] METHOD OF MAKING A FLASH EPROM DEVICE HAVING A DRAIN EDGE P+ IMPLANT

[75] Inventor: Gary Hong, Hsinchu, Taiwan

[73] Assignee: United Microelectronics Corporation, Hsinchu, Taiwan

[21] Appl. No.: 346,866

[22] Filed: Nov. 30, 1994

[51] Int. Cl.⁶ .................................. H01L 21/8247
[52] U.S. Cl. .......................... 437/43; 437/44; 437/158
[58] Field of Search ....................... 437/38, 43, 44, 437/149, 150, 158, 984

[56] References Cited

U.S. PATENT DOCUMENTS

| 4,442,589 | 4/1984 | Doo et al. | 437/44 |
| 4,814,286 | 3/1989 | Tam | 437/43 |

FOREIGN PATENT DOCUMENTS

| 60-53083 | 3/1985 | Japan | 437/44 |

*Primary Examiner*—Chandra Chaudhari
*Attorney, Agent, or Firm*—George O. Saile; Graham S. Jones, II

[57] ABSTRACT

A MOSFET device has a floating gate and a control gate formed over a lightly P– doped semiconductor substrate with an N+ source region and an N+ drain region, includes a tunnel oxide dielectric layer on the substrate. A stack of gate layers includes a floating gate conductor overlying the first dielectric layer, an interconductor, ONO, dielectric layer over the floating gate conductor, and a control gate electrode over the interconductor dielectric layer. A P+, ion implanted, drain edge region is adjacent to the drain region in the substrate. The N+ source region and the N+ drain region are self-aligned with the stack, and an ion implanted N– region in the substrate is formed beneath the N+ source. Source/drain implant regions comprises arsenic ions implanted at between about 30 keV and about 100 keV and between about 1E15 cm⁻² and about 8E15 cm⁻². In manufacture a sacrificial layer is formed over the stack, then etched away from the device to form, with a mask, a deep trench adjacent to the source region and a trench adjacent the drain region between the edges of the stack and the mask.

21 Claims, 7 Drawing Sheets

METHOD OF MAKING A FLASH EPROM DEVICE HAVING A DRAIN EDGE P+ IMPLANT

BACKGROUND OF THE INVENTION

1. Field of the Invention

This invention relates to semiconductor memories and more particularly to EPROM cells and the method of manufacture thereof.

2. Description of Related Art

Figure 2:
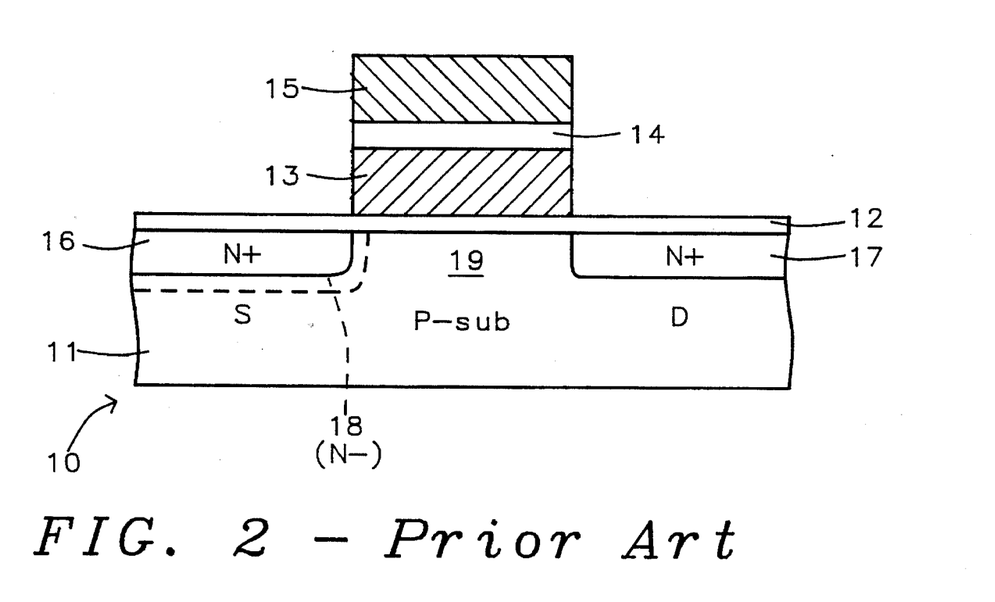
FIG. 2 shows a conventional prior art Flash EPROM cell.

FIG. 2 shows a conventional prior art Flash EPROM cell 10 formed starting with a P-substrate 11 including N+ source region 16, N+ drain region 17 and N– region 18. Doped regions 18 and 17 define the ends of the channel region 19. Directly above the channel region 19 and above tunnel oxide layer 12 is formed a three level stack including from bottom to top (polysilicon 1) floating gate 13, (ONO) interpolysilicon dielectric 14 and (polysilicon 2) control gate 15. The floating gate 13 is formed on the tunnel oxide layer 12. Interpolysilicon dielectric layer 14 overlies the floating gate 13. Control gate 15 overlies the interpolysilicon dielectric layer 14. The lower left edge of floating gate 13 overlies the right end of N+ region 16 in the substrate 11. The lower right edge of floating gate 13 overlies the left end of N+ region 17 in substrate 11. Beneath the N+ source region 16 is the N– region 18 which extends a short distance beneath tunnel oxide layer 12 under the left end of floating gate 13. A significant drawback of this design is that a dual power supply is needed. To program the memory cell shown in FIG. 2, the drain voltage required is about 7 Volts. As an example of the programming condition the parameters are as follows:

$V_D$=7 Volts Drain $V_{CG}$=12 Volts Control Gate $V_S$=0 Volts Source

The above voltages are required to have a field sufficient for hot channel electrons for injection from the drain Junction into the floating gate.

SUMMARY OF THE INVENTION

An object of this invention is a flash EPROM cell structure and method of manufacture which requires less voltage on the drain and yet sustain sufficient electric field to program the cell. A lower drain voltage requirement permits avoidance of the requirement for dual external power supplies in order to operate the device.

In accordance with an embodiment of this invention a MOSFET device with a floating gate and a control gate formed over a lightly P– doped semiconductor substrate with an N+ source region and an N+ drain region is provided. A first dielectric layer on the substrate; a stack comprising a floating gate conductor over the first dielectric layer, an interconductor dielectric layer over the floating gate conductor, and a control gate structure over the interconductor dielectric layer. A P+ ion implanted drain edge region adjacent to the drain region in the substrate. The N+ source region and the N+ drain region being self aligned with the stack, and an ion implanted N– region in the substrate beneath the N+ source. The source/drain implant region comprises arsenic ions implanted at between about 30 keV and about 100 keV and between about 1E15 cm$^{-2}$ and about 8E15 cm$^{-2}$. It is preferred that the drain edge P+ implant region comprises boron ions implanted between about 20 keV and about 100 keV and between about 5E13 cm$^{-2}$ and about 5E14 cm$^{-2}$.

Preferably, the first dielectric layer comprises silicon dioxide with a thickness between about 50 Å and about 120 Å. The interconductor dielectric layer comprises ONO. The floating gate layer comprises polysilicon and the control gate layer comprises a material selected from polysilicon and polycide.

In accordance with another aspect of this invention, a first dielectric layer comprises a tunnel oxide having thickness of about 90 Å.

An additional source implant comprises phosphorus ions implanted between about 30 keV and about 100 keV and between about 8E13 cm$^{-2}$ and about 5E14 cm$^{-2}$.

In accordance with this invention, a method is provided for fabricating an MOSFET device with a floating gate and a control gate formed over a lightly P– doped semiconductor substrate with an N+ source region and an N+ drain region. The method commences with forming a tunnel oxide layer on the substrate. Subsequently, a stack is formed comprising a polysilicon 1 floating gate conductor over the tunnel oxide layer, an Interpolysilicon dielectric layer over the floating gate conductor, and a control gate structure over the interpolysilicon dielectric layer. Then a sacrificial layer is formed on the stack. The sacrificial layer comprises a material selected from silicon nitride and silicon dioxide, the sacrificial layer having a thickness between about 800 Å and 3,000 Å thick. Next, a mask is formed leaving the top surface of the stack exposed. The sacrificial layer is then removed from the device thereby forming a trench adjacent to the source region and a trench adjacent the drain region between the edges of the stack and the mask. A P+ dose is ion implanted into the trench adjacent to the drain region to form a P+ drain edge implant region adjacent to the drain region in the substrate. Then ions are ion implanted to form the N+ source and the N+ drain regions self aligned with the stack. Ions are next ion implanted to form an N– region in the substrate beneath the N+ source.

Preferably, the tunnel oxide layer has a thickness within a range from between about 50 Å and about 120 Å. It is also preferred that the interpolysilicon dielectric layer comprises ONO, that the floating gate layer comprises polysilicon and the control gate layer comprises a material selected from polysilicon and polycide. Also it is preferred that the drain edge P+ implant employs implantation of boron ions between about 20 keV and about 100 keV and between about 5E13 cm$^{-2}$ and about 5E14 cm$^{-2}$.

It is also preferred that the sacrificial layer is about 1000 Å thick, or tunnel oxide layer comprises a tunnel oxide having thickness of about 90 Å.

It is preferred that the source/drain implant employs implantation of arsenic ions at between about 30 keV and about 100 keV and between about 1E15 cm$^{-2}$ and about 8E15 cm$^{-2}$; and additional source implant employs implantation of phosphorus ions between about 30 keV and about 100 keV and between about 8E13 cm$^{-2}$ and about 5E14 cm$^{-2}$.

In accordance with another aspect of this invention, a method is provided for fabricating an MOSFET device with a floating gate and a control gate formed over a lightly P– doped semiconductor substrate with an N+ source region and an N+ drain region. The method comprises forming a first dielectric layer on said substrate. Then a stack comprising a floating gate conductor over the first dielectric layer, an interconductor dielectric layer over the floating gate conductor, and a control gate structure over the interconductor dielectric layer is formed. A sacrificial layer is formed over the stack. Then a mask is formed over the device in its current state of manufacture leaving the top surface of the stack exposed. Then the sacrificial layer is removed from the device by a subtractive process (etching) thereby forming a trench adjacent to the source region and a trench adjacent the drain region between the edges of the stack and the mask. Next, a drain edge P+ ion implant region is ion implanted into the trench adjacent to the drain region adjacent to the drain region in the substrate. Subsequently, a source/drain ions are is ion implanted to form the N+ source/drain regions self aligned with the stack. In addition, N− ions are ion implanted to form an N− region in the substrate beneath the N+ source.

Preferably, the first dielectric layer comprises silicon dioxide with a thickness between about 50 Å and about 120 Å; interconductor dielectric layer comprises ONO and floating gate layer comprises polysilicon; and the control gate layer comprises a material selected from polysilicon and polycide.

It is also preferred that the sacrificial layer comprises a material selected from silicon nitride and silicon dioxide, the sacrificial layer having a thickness between about 800 Å and 3,000 Å thick; and the first dielectric layer comprises a tunnel oxide having thickness of about 90 Å.

Preferably, the drain edge P+ implant employs implantation of boron ions between about 20 keV and about 100 keV and between about 5E13 cm$^{-2}$ and about 5E14 cm$^{-2}$.

Still another aspect of this invention is that the source/drain implant employs implantation of arsenic ions at between about 30 keV and about 100 keV and between about 1E15 cm$^{-2}$ and about 8E15 cm$^2$.

An additional source implant employs implantation of phosphorus ions between about 30 keV and about 100 keV and between about 8E13 cm$^{-2}$ and about 5E14 cm$^{-2}$.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
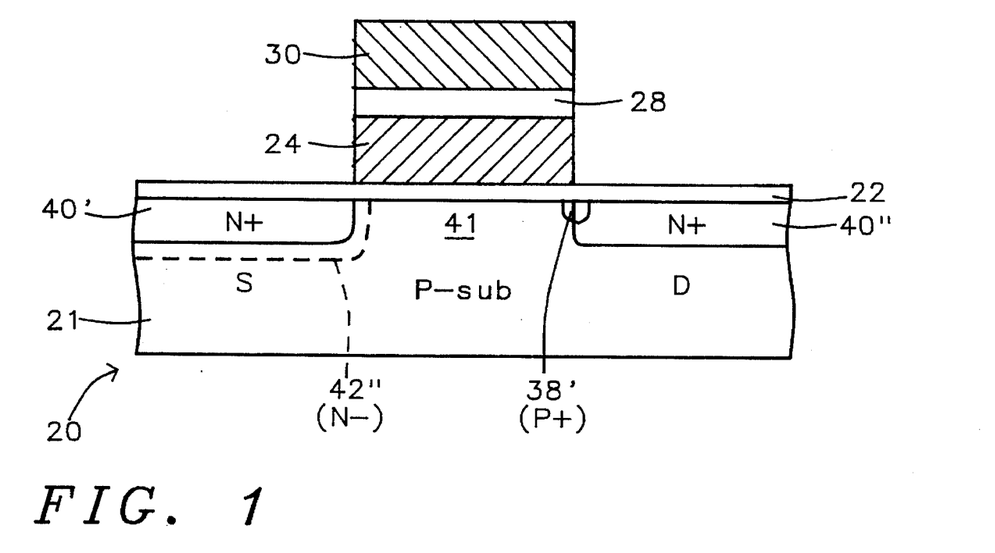
FIG. 1 shows an EPROM memory device in accordance with this invention.

This invention provides an EPROM memory device in accordance with this invention. FIG. 1 shows an EPROM memory device in accordance with this invention with an EPROM cell structure which requires less voltage on the drain and yet sustains sufficient electric field to program the cell. A lower drain voltage requirement avoids the requirement for dual external power supplies in order to operate the device.

FIGS. 3A–3K show a process for making the device of FIG. 1 in accordance with this invention.

Referring to FIG. 1, EPROM memory device 20 is formed on a silicon substrate 21 including N+ doped source region 40', N+ doped drain region 40", P+ doped region 38', and N− doped region 42". N− doped regions 42" on the left and P+ doped region 38' and N+ region 40" on the right define the ends of the channel region 41 of EPROM device 20. A tunnel oxide layer 22 overlies the surface of the substrate 21. The pair of source/drain regions including N+ doped source region 40' and N+ doped drain region 40" are located below the tunnel oxide layer 22 extending down below the surface into substrate 21, N− doped region 42" lies below and to the right of N+ doped source region 40' P+ doped region 38' lies below and at the left upper portion of N+ doped drain region 40". Directly above the channel region 41 and above tunnel oxide layer 22 is formed a gate stack including (polysilicon 1) floating gate 24, (ONO) interpolysilicon (interconductor) layer dielectric 28 and (polysilicon 2) control gate 30. The floating gate 24 is formed on the tunnel oxide layer 22. Interpolysilicon dielectric layer 28 overlies the floating gate 24. Control gate 30 overlies the interpolysilicon dielectric layer 28. The lower left edge of floating gate 24 overlies the right end of N+ region 40' in the substrate 21. The lower right edge of floating gate 24 overlies the P+ region 38 which overlies the left end of N+ region 40" in substrate 21. Beneath the N+ source region 40' is the N− region 42" which extends a short distance beneath tunnel oxide layer 22 under the left end of floating gate 24. The narrow N+ drain side region increases the E-field to enhance the programming operation. The narrowing of the P+ area only at the edge of the drain region will create a sharp high field near the drain to floating gate interface region helping the hot-channel-electron injection and will not increase the drain junction capacitance, which is crucial for high speed product design.

FIGS. 3A–3K show the process flow in accordance with this invention, providing a sequence of cross-sectional illustrations (taken along the same section line) of the process of manufacture of the device 20 of FIG. 1.

Figure 3A:
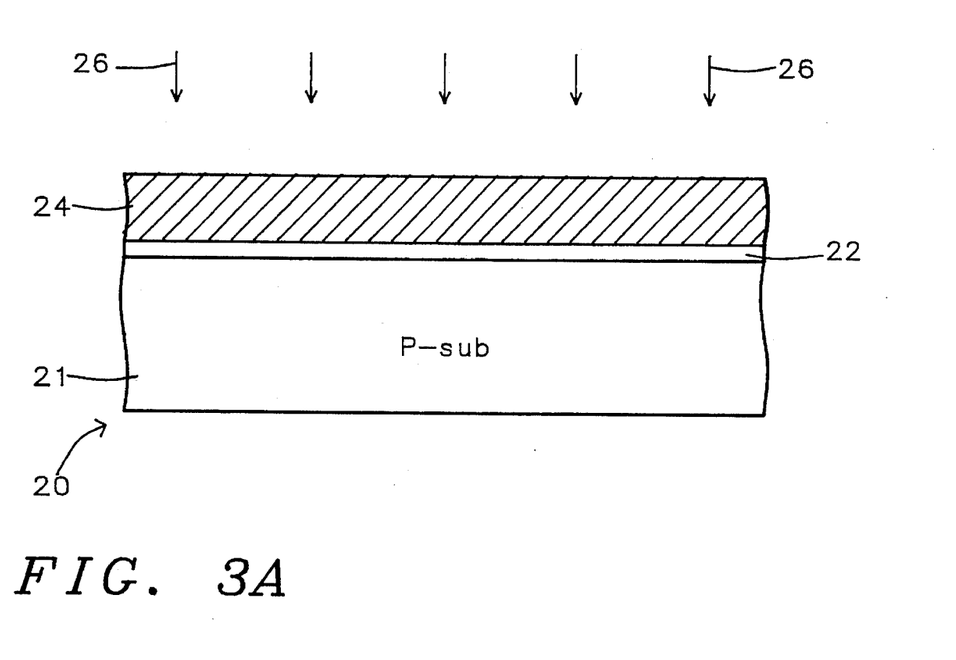
FIGS. 3A–3K show a process for making the device of FIG. 1 in accordance with this invention.

Referring to FIG. 3A, the device 20 is shown in the early stages of fabrication in accordance with the method of this invention, with a P− doped silicon substrate 21 which has been produced by a conventional doping process, etc.

Referring to FIG. 3A, the tunnel oxide layer 22 has been formed. By the conventional process of gate oxidation, the substrate 21 is covered with a blanket of a first dielectric (silicon dioxide) tunnel oxide layer 22 having a preferred thickness of 90 Å deposited in accordance with a thermal oxidation at about 900° C. using a process well known by those skilled in the art. The thickness ranges from about 50 Å to about 120 Å.

Referring again to FIG. 3A the device 20 is shown after a floating gate layer 24 is deposited on tunnel oxide layer 22 and layer 24 is doped. After forming blanket (floating gate) polysilicon 1 layer 24 by deposition to a preferred range of thicknesses from about 1,000 Å to about 2,000 Å by the conventional LPCVD (low pressure chemical vapor deposition) process. A possible maximum range of thickness is from about 500 Å to about 5,000 Å.

Subsequently, the polysilicon 1 layer 24 is doped in a blanket application of N+ dopant 26 of phosphoryl chloride (POCl$_3$) at 900° C. for 20 minutes or by ion implantation. The implanted arsenic (As) dopant 26 is applied with a dose within a range from about 1E14 cm$^{-2}$ to about 1E16 cm$^{-2}$ within a range of energies from about 30 keV to about 100 keV.

Figure 3B:
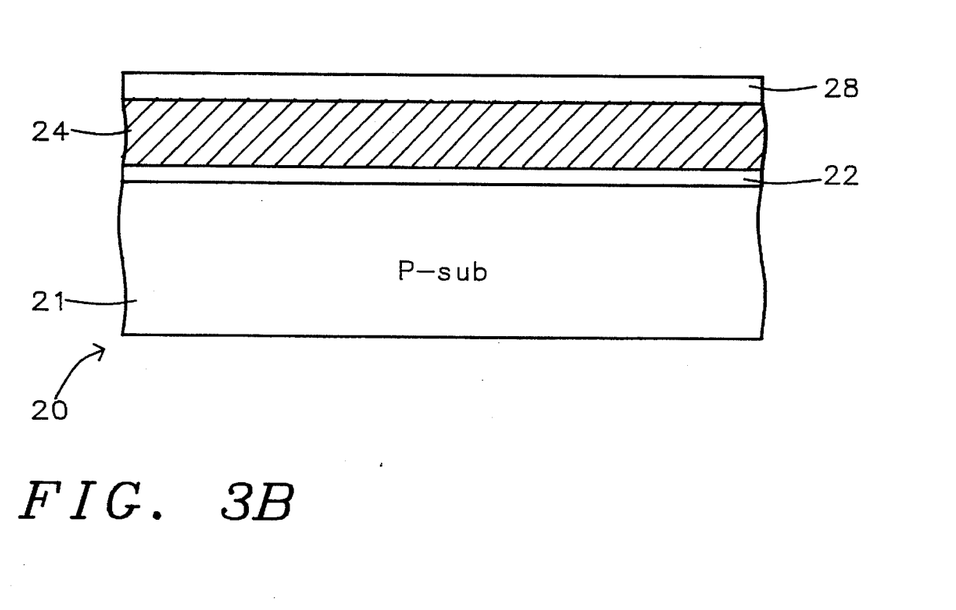

Referring to FIG. 3B, the device of FIG. 3A is shown after the formation of a dielectric, interpolysilicon sandwich in the form of a thin film 28 (e.g. silicon dioxide or the effective silicon oxide thickness of ONO film.) In the case of an ONO film a thickness of ONO, silicon dioxide preferably of about 200 Å with a range of thicknesses between about 100 Å and about 300 Å applied to the exposed surface of polysilicon 1 layer 24 of the device of FIG. 3A by means of the conventional process.

Figure 3C:
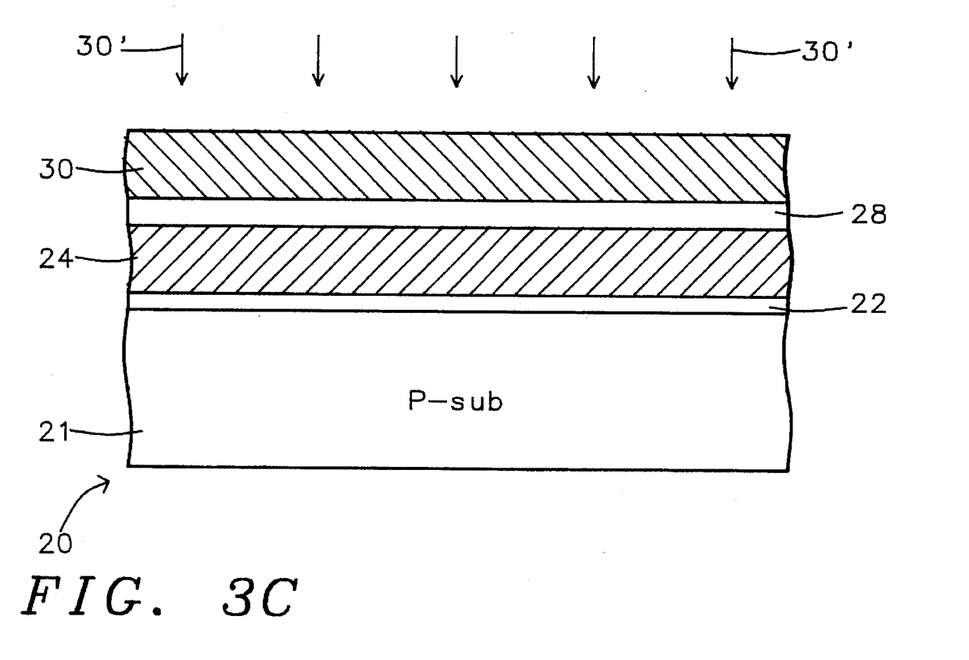

Then, referring to FIG. 3C, control gate deposition and doping have been performed. A blanket control gate layer 30 composed of polysilicon 2 was deposited over interpolysilicon, thin film 28. Control gate layer 30 is deposited to a preferred range of thicknesses from about 1,000 Å to about 5,000 Å by a conventional LPCVD (low pressure chemical vapor deposition) process.

Subsequently, the polysilicon 2 layer 30 was doped. Doping can be done by a blanket application of phosphoryl chloride ($POCl_3$) dopant at 900° C. for 20 minutes or by ion implantation with ions 30'. Alternatively, the implanted arsenic (As) dopant 26 is applied with a dose within a range from about $1E14$ $cm^{-2}$ to about $1E16$ $cm^{-2}$ within a range of energies from about 30 keV to about 100 keV. Instead of polysilicon 2 material, the upper layer 30 can be composed of polycide, e.g. $WSi_2$, $MoSi_2$, or $TaSi_2$.

Figure 3D:
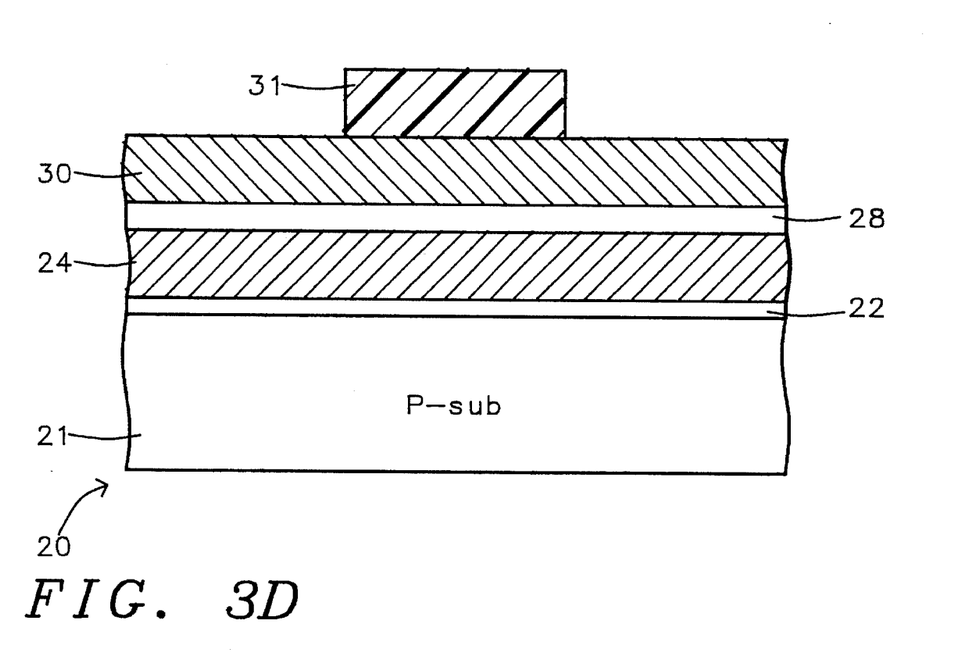

Then, referring to FIG. 3D, a mask for stacked gate-channel patterning is shown. A photoresist mask 31 is formed incorporating openings with a channel pattern shielding just the portions of the stacked polysilicon 2 layer 30, the ONO layer 28 and the polysilicon 1 layer 24 to be formed into the floating and control gates 24 and 30 to be formed above the channel 41 between S/D regions 40' and 40" as shown in FIG. 1.

Figure 3E:
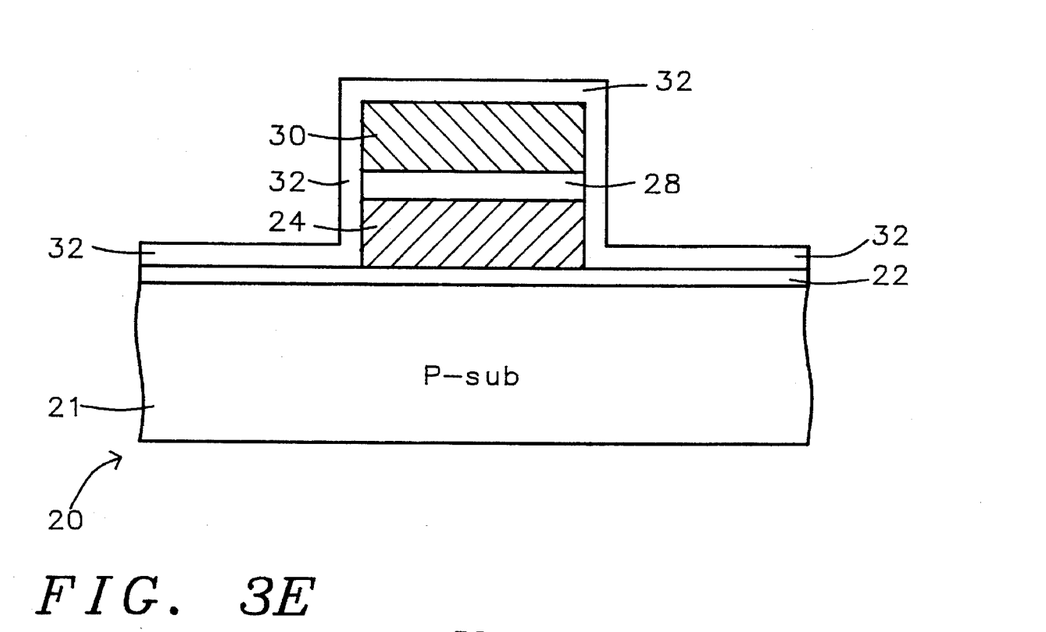

FIG. 3E shows the result of etching of stacked gates. In particular, FIG. 3E shows the product of FIG. 3D after the mask 31 has been used during an etching process in which the polysilicon 2 layer 30 has been etched into the pattern of mask 31 by removing the stack of polysilicon 2 layer 30, the ONO layer 28 and the polysilicon 1 layer 24 down to tunnel oxide layer 22, where the mask 31 provides no protection. The stack is preferably etched using a conventional dry plasma etching method.

Next, the mask 31 is stripped from device 20 leaving the gate stack on tunnel oxide layer 22 on substrate 21.

Referring again to FIG. 3E, a blanket deposition of a sacrificial dielectric layer 32 has been formed over the entire device 20 of FIG. 3E, after mask 31 was stripped. The device 12 is shown after the etching and subsequent stripping of mask 31 and after deposition of a blanket, dielectric, sacrificial layer 32. A preferred material for dielectric layer 32 comprises silicon nitride which can be formed by LPCVD in a furnace at 700°–800° C. to a thickness preferably about 1000 Å thick and having a possible range of thicknesses from about 800 Å to about 3,000 Å. Alternatively, layer 32 can be deposited by formation of $SiO_2$ using a conventional CVD process.

Figure 3F:
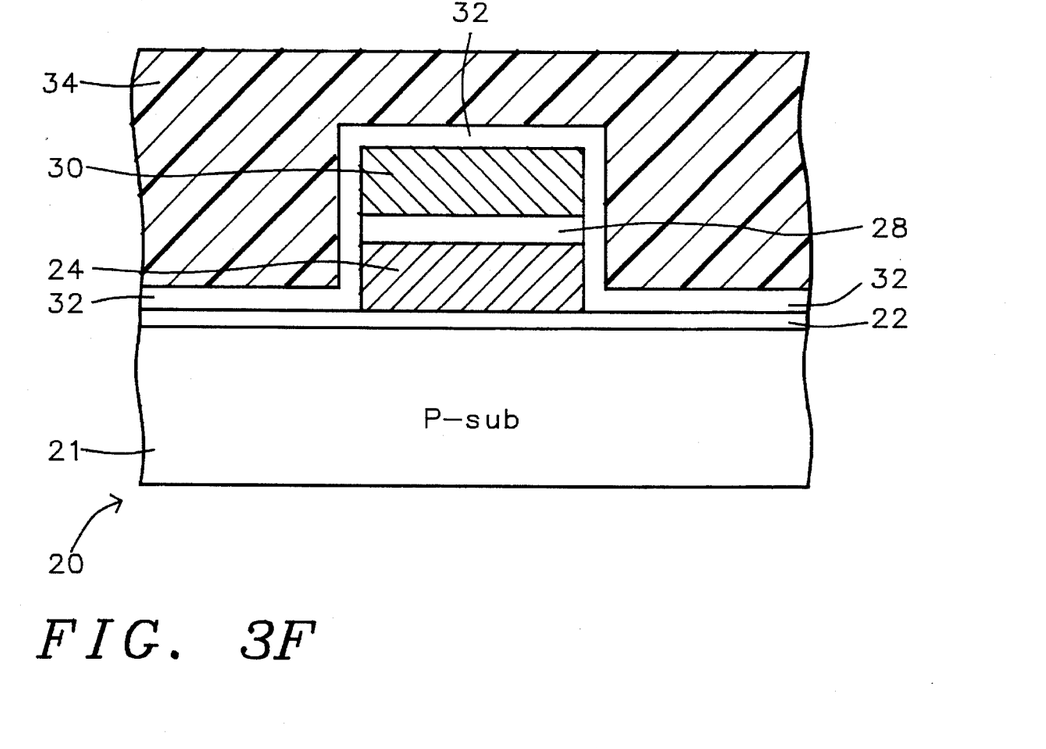

Referring to FIG. 3F, a masking layer 34 has been deposited on the device 20. The product of FIG. 3E is shown after deposition of a blanket layer of a masking material 34 such as photoresist spun onto device 20 is formed covering the entire device 21 including sacrificial layer 32 with the masking material 34. The thickness is between about 5,000 Å and about 20,000 Å. The photoresist is applied on the surface of the nitride with the surface of the photoresist made flat. Alternatively, the masking material can be SOG (spin on glass.)

Figure 3G:
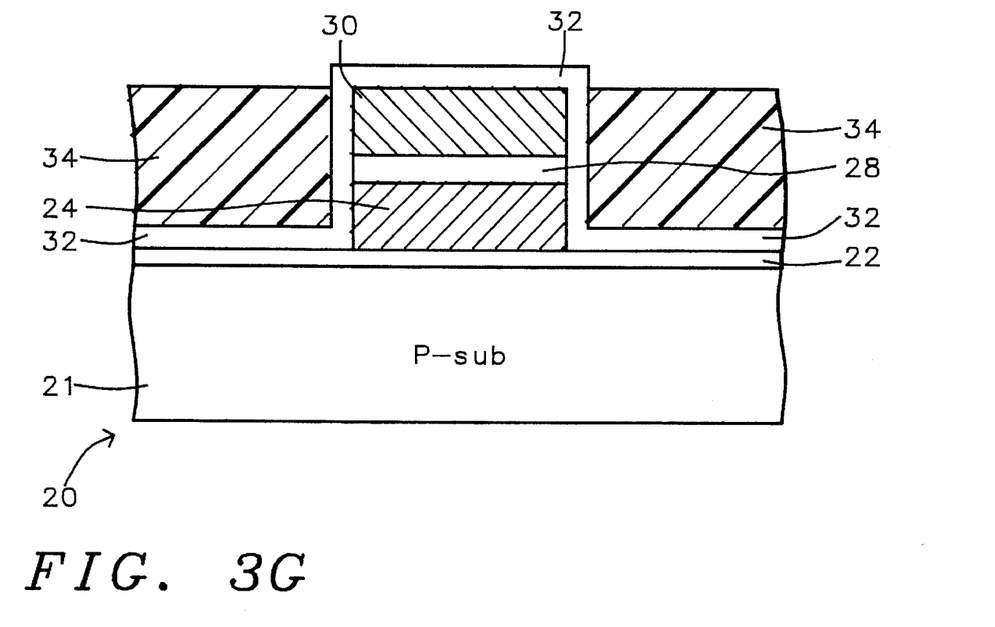

Referring to FIG. 3G, the masking material 34 has been etched back. The product of FIG. 3F is shown after performance of an etch back process of removing masking material 34. This etching process is completed when the surface of the silicon nitride layer 32 deposited on the top of the control gate 30 has been exposed in part. The etching can be done in an $O_2$-based plasma dry etching process. The etching process can be timed in a conventional manner to provide the degree of etching required.

Figure 3H:
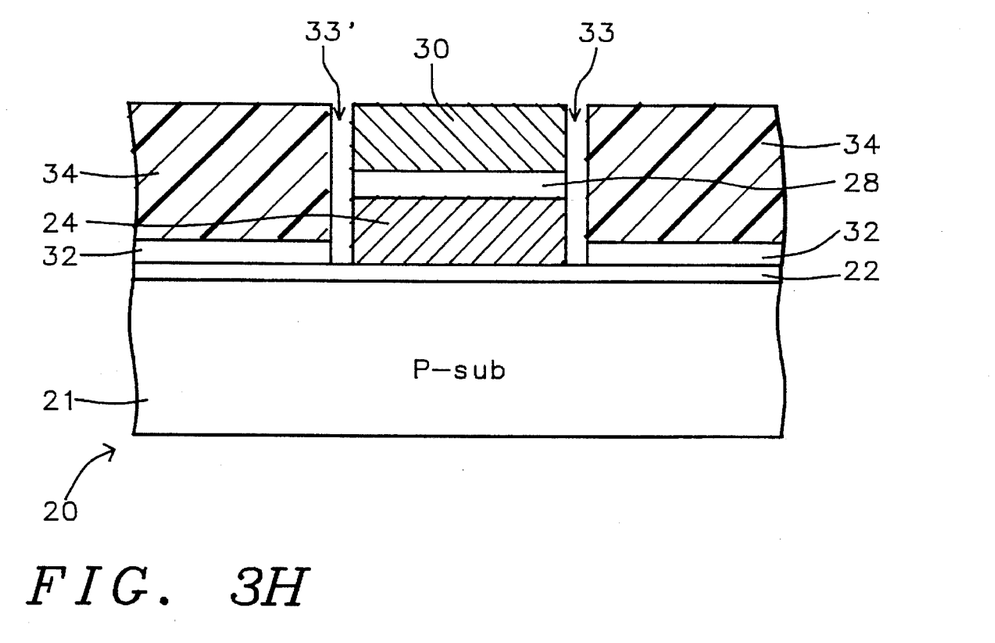

Referring to FIG. 3H, the sacrificial layer 32 has been etched forming deep trenches 33 and 33'. The device 20 as shown in FIG. 3G is shown after most of the sacrificial layer 32 has been etched away to form trenches 33 and 33' down to tunnel oxide layer 22 adjacent to the gate stack of layers 24, 26 and 28. At this point in manufacture, the layer 32 remains beneath the masking material 34. Trenches 33 and 33' have photoresist 34 as a wall on one side and the gate stack 24, 28, 30 as the wall on the other side of the trench. The etching process for forming trenches 33 and 33' is performed by 1) removing the silicon nitride layer 32 with a phosphoric acid solution or 2) by plasma etching, which can have very good selectivity over polysilicon or polycide material in layers 24 and 30.

Next, a photoresist baking step follows, in which the photoresist layer 34 of FIG. 3H is subjected to conventional U.V. (ultraviolet) baking of photoresist layer 34 to harden layer 34 so that the second spin of photoresist can be done in the next step without peeling the first photoresist layer 34.

Figure 3I:
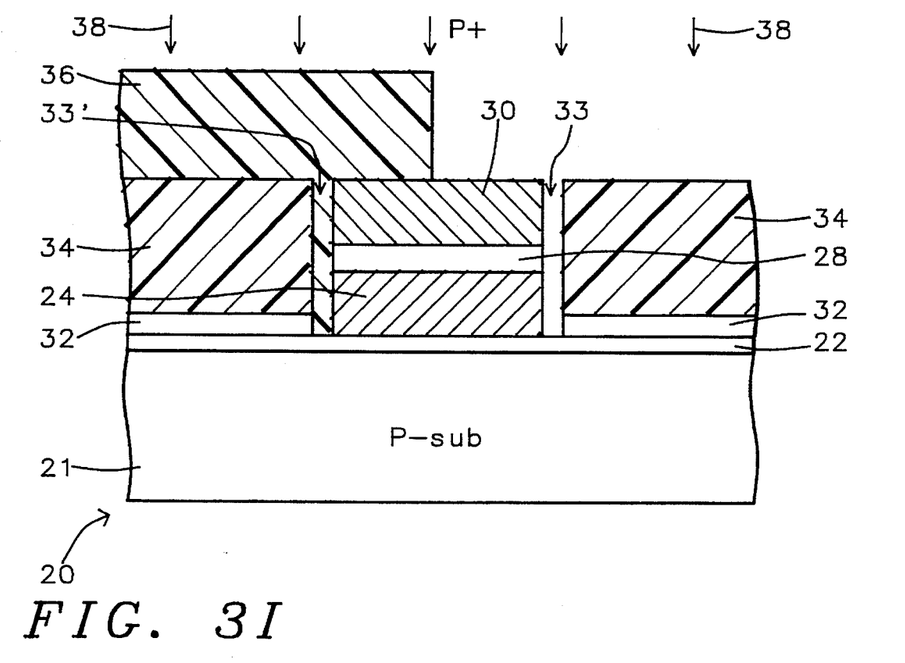

In FIG. 3I, the product of FIG. 3H is shown after formation of a source side photoresist mask 36. Mask 36 is formed over the source side (left side) of the device including approximately the left half of the gate stack 24, 28, 30. The right side of the device including trench 33 to the right of the gate stack 24, 28, 30 is exposed.

Referring again to FIG. 3I, after formation of mask 36, ion implantation of P+ ions into trench 33 on the drain side region of the device 21 has been performed. As shown by FIG. 3H, the region 38' of substrate 21 at the base of trench 33 is doped by P+ ions 38 ion implanted through trench 33 (serving as an opening in a mask composed of photoresist layer 34 and gate stack of layers 24, 28 and 30) with dopant ions 38 of boron by ion implantation. The doping of ions 38 serves to form P+ region on the drain side of the channel region 41 in FIGS. 1 and 3J below. With reference to the mask defining trenches 33, the gate stack 24, 28, 30 provides a wall on one side of the trench 33, and thus it serves as a self-aligned mask for the implantation of ions in substrate 21. The P+ boron dopant 38 is preferably applied with a dose of about $1E14$ $cm^{-2}$ with an energy of about 50 keV. Possible parameters of the process include a dose within a range from about $1E13$ $cm^{-2}$ to about $5E15$ $cm^{-2}$ within a range of energies from about 20 keV to about 80 keV.

The photoresist masking layer 36 is then stripped along with the photoresist layer 34 leaving the gate stack 24, 28, 30 upon the tunnel oxide layer 22 exposed.

Next, an additional etching step for removing the remainder of sacrificial layer 32 is performed. The etching removes the remaining portion of sacrificial layer 32 (silicon nitride) (which was not removed previously in the step described in connection with FIG. 3H). For example, the etching of the remaining silicon nitride layer 32 can be done with a phosphoric acid solution.

Figure 3J:
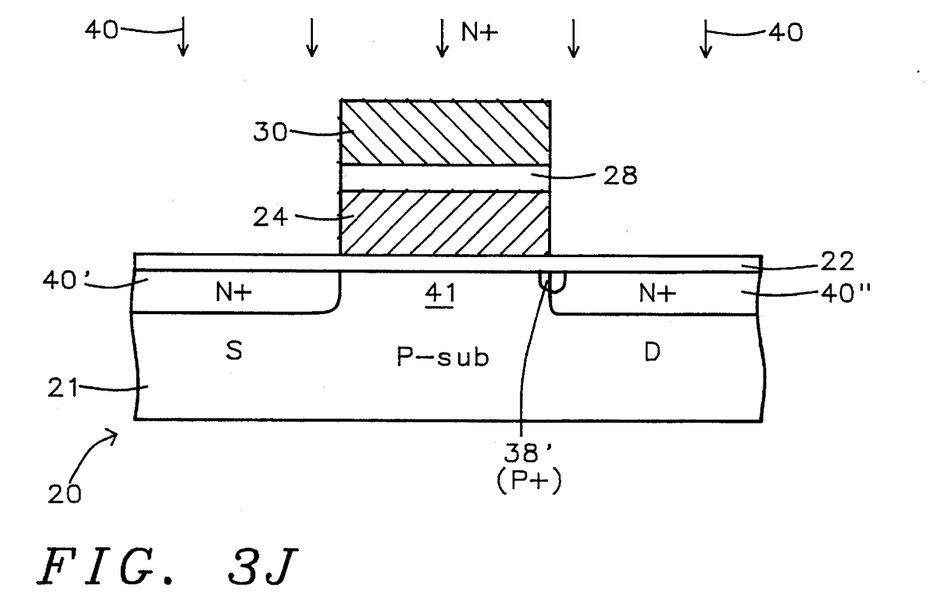

Referring to FIGS. 3J, the product of FIG. 3I is shown after formation of the source and the drain 40' and 40" by an N+ source/drain ion implantation with ions 40. The N+ S/D (source/drain) arsenic (As) dopant 40 is implanted into N+ regions 40' and 40" on either side of the channel 41. Below the exposed surfaces of the tunnel oxide layer 22 S/D regions 40' and 40" are formed in the P-substrate 21 on either side of the control gate 30 and floating gate 24 which along with interpolysilicon oxide layer 28 to provide self-aligned masking to prevent ion implantation below the gate electrodes 24 and 30. The implantation of As ions 40 is performed with an energy of about 50 keV. A dose of As ions 40 of about $5E15$ $cm^{-2}$ is preferred. Possible parameters of the process include a dose within a range from about 1E15 cm$^{-2}$ to about 8E15 cm$^{-2}$ within a range of energies from about 30 keV to about 100 keV.

Figure 3K:
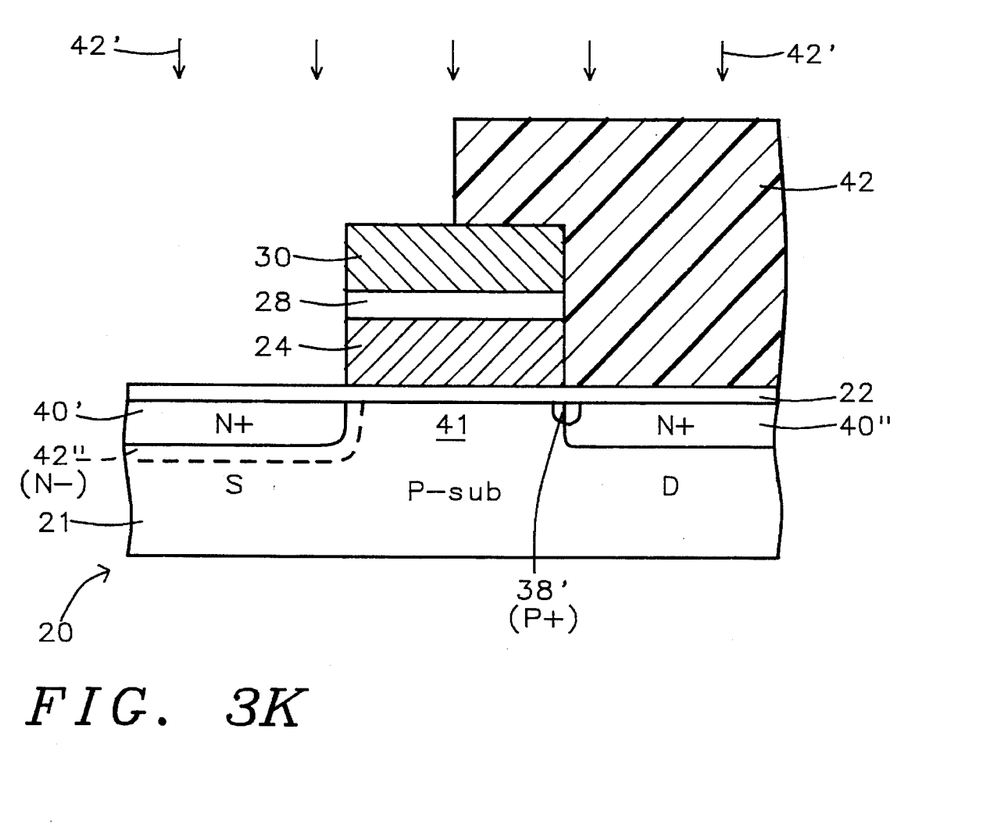

In FIG. 3K, the product of FIG. 3J is shown after masking of the drain side of the device 20. A photoresist mask 42 is formed over the drain side (right side) of the device including approximately the right half of the gate stack 24, 28, 30. The left side of the device including under the source region 40' is ion implanted with N− phosphorous ions to provide an N− region in the device below N+ region 40' and to the right of N+ region 40' thereby defining one side of channel 41.

A graded N− source junction ion implant occurs next. In this case an implantation of As ions 42' is performed at an energy of about 50 keV. A dose of As ions 42' of about 1E14 cm$^{-2}$ is preferred. This ion implantation step provides a graded source junction to reduce band-to-band tunneling during the erase operation.

The conventional back end process steps follow including deposition of a glass (BPSG) layer that is heated to cause it to flow, contact formation, metallization and passivation.

Over the structure, described above in connection with FIG. 1, a BPSG glass layer is been formed using a conventional process and then heated to flow in a conventional manner. Then a contact opening is formed through the BPSG layer extending through the tunnel oxide layer and metallization is formed reaching down though the contact opening in the BPSG layer into contact with a doped S/D region. The metallization extends across the device above the BPSG layer.

Summary

This invention utilized the silicon nitride layer 32 having a thickness of about 1,000 Å plus the process of photoresist etching back to create a narrow self-aligned opening for the drain and a P+ opening to increase the E-field to enhance the generation of hot channel electrons during programming operations. To narrow the P+ area only at the edge of the drain region will create a sharp high electric field there helping the hot-channel-electron injection. It will not increase the drain junction capacitance, which is crucial for high speed product design.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating an EPROM device with a floating gate and a control gate formed over a lightly doped P type semiconductor substrate with an N+ source region and an N+ drain region, said method comprising, forming a first dielectric layer on said substrate, forming a stack having a top and sidewalls comprising a floating gate over said first dielectric layer, an interconductor dielectric layer over said floating gate, and a control gate over said interconductor dielectric layer, forming a sacrificial layer over said top and said sidewalls of said stack and over said first dielectric layer, forming a first mask leaving said sacrificial layer over said top of said stack exposed, removing said sacrificial layer from said top and said sidewalls of said stack thereby forming a trench adjacent to said source region and a trench adjacent to said drain region between said sidewalls of said stack and said first mask, ion implanting into said trench adjacent to said drain region to form a drain edge P+ implant region in said substrate by masking said trench adajcent to said source region with a second mask, removing said second mask, said first mask and said sacrificial layer over said first dielectric layer, performing a source/drain implant to form said N+ source and said N+ drain regions self aligned with said stack, and forming an N− region in said substrate beneath said N+ source region by an additional source implant.

2. A method in accordance with claim 1 wherein said first dielectric layer comprises silicon dioxide with a thickness between about 50 Å and about 120 Å.

3. A method in accordance with claim 2 wherein said interconductor dielectric layer comprises ONO.

4. A method in accordance with claim 3 wherein said floating gate comprises polysilicon and said control gate comprises a material selected from the group consisting of polysilicon and polycide.

5. A method in accordance with claim 1 wherein said sacrificial layer comprises a material selected from the group consisting of silicon nitride and silicon dioxide, said sacrificial layer having a thickness between about 800 Å and 3,000 Å thick.

6. A method in accordance with claim 5 wherein said first dielectric layer comprises a tunnel oxide having a thickness of about 90 Å.

7. A method in accordance with claim 1 wherein said drain edge P+ implant employs implantation of boron ions at an energy between about 20 keV and about 100 keV and a dose between about 5E13 cm$^{-2}$ and about 5E14 cm$^{-2}$.

8. A method in accordance with claim 5 wherein said drain edge P+ implant employs implantation of boron ions at an energy between about 20 keV and about 100 keV and between about 5E13 cm$^{-2}$ and about 5E14 cm$^{-2}$.

9. A method in accordance with claim 1 wherein said source/drain implant employs implantation of arsenic ions at an energy between about 30 keV and about 100 keV and a dose between about 1E15 cm$^{-2}$ and about 8E15 cm$^{-2}$.

10. A method in accordance with claim 9 wherein said additional source implant employs implantation of phosphorus ions at an energy between about 30 keV and about 100 keV and a dose between about 8E13 cm$^{-2}$ and about 5E14 cm$^{-2}$.

11. A method of fabricating an EPROM device with a floating gate and a control gate formed over a lightly doped P type semiconductor substrate with an N+ source region and an N+ drain region, said method comprising, forming a tunnel oxide layer on said substrate, forming a stack having a top and sidewalls comprising a floating gate over said tunnel oxide layer, an interpolysilicon dielectric layer over said floating gate, and a control gate over said interpolysilicon dielectric layer, forming a sacrificial layer on said top and said sidewalls of said stack and over said tunnel oxide layer, said sacrificial layer comprising a material selected from the group consisting of silicon nitride and silicon dioxide, forming a first mask leaving said sacrificial layer over said top of said stack exposed, removing said sacrificial layer from said top and said sidewalls of said stack, thereby forming a trench adjacent to said source region and a trench adjacent to said drain region between said sidewalls of said stack and said first mask, ion implanting into said trench adjacent to said drain region to form a drain edge P+ implant region in said substrate by masking said trench adjacent to said source region with a second mask, removing said second mask, said first mask and said sacrificial layer over said tunnel oxide layer, performing a source/drain implant to form said N+ source and said N+ drain regions self aligned with said stack, and forming an N− region in said substrate beneath said N+ source region by an additional source implant.

12. A method in accordance with claim 11 wherein said tunnel oxide layer has a thickness between about 50 Å and about 120 Å.

13. A method in accordance with claim 12 wherein said interpolysilicon dielectric layer comprises ONO.

14. A method in accordance with claim 13 wherein said floating gate comprises polysilicon and said control gate comprises a material selected from the group consisting of polysilicon and polycide.

15. A method in accordance with claim 11 wherein said sacrificial layer is about 1000 Å thick.

16. A method in accordance with claim 11 wherein said tunnel oxide layer has a thickness of about 90 Å.

17. A method in accordance with claim 11 wherein said drain edge P+ implant employs implantation of boron ions at an energy between about 20 keV and about 100 keV and a dose between about 5E13 $cm^{-2}$ and about 5E14 $cm^{-2}$.

18. A method in accordance with claim 15 wherein said drain edge P+ implant employs implantation of boron ions at an energy between about 20 keV and about 100 keV and a dose between about 5E13 $cm^{-2}$ and about 5E14 $cm^{-2}$.

19. A method in accordance with claim 11 wherein said source/drain implant employs implantation of arsenic ions at an energy between about 30 keV and about 100 keV and a dose between about 1E15 $cm^{-2}$ and about 8E15 $cm^{-2}$.

20. A method in accordance with claim 19 wherein said additional source implant employs implantation of phosphorus ions at an energy between about 30 keV and about 100 keV and a dose between about 8E13 $cm^{-2}$ and about 5E14 $cm^{-2}$.

21. A method in accordance with claim 11 wherein said sacrificial layer is between about 800 Å and 3000 Å thick.

* * * * *